United States Patent
Awaji et al.

(10) Patent No.: US 6,344,713 B1
(45) Date of Patent: *Feb. 5, 2002

(54) PLASMA DISPLAY PANEL WITH DIELECTRIC LAYER SUPPRESSING REDUCED ELECTRODE CONDUCTIVITY

(75) Inventors: Noriyuki Awaji; Keiichi Betsui; Shinji Tadaki, all of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/892,264

(22) Filed: Jul. 14, 1997

(30) Foreign Application Priority Data

Feb. 24, 1997 (JP) .................................. 9-038932

(51) Int. Cl.⁷ ................................................ H01J 17/49
(52) U.S. Cl. ...................... 313/582; 313/586; 313/584
(58) Field of Search ................. 313/582, 587, 313/586, 585, 509, 584; 345/37, 60, 62, 66, 71; 501/76, 79, 26

(56) References Cited

U.S. PATENT DOCUMENTS

| | | | |
|---|---|---|---|
| 4,028,578 A | 6/1977 | Byrum, Jr. et al. | 313/582 |
| 4,066,925 A * | 1/1978 | Dickson | 313/509 |
| 4,255,474 A | 3/1981 | Smith, Jr. | |
| 4,708,914 A * | 11/1987 | Kamijo | 313/509 |
| 4,803,402 A * | 2/1989 | Raber et al. | 313/587 |
| 5,589,733 A | 12/1996 | Noda et al. | |
| 5,742,122 A * | 4/1998 | Amemiya et al. | 313/582 |

FOREIGN PATENT DOCUMENTS

| | | |
|---|---|---|
| JP | 3-170346 | 7/1991 |
| JP | 5-165042 | 6/1993 |
| JP | 6-243788 | 9/1994 |
| JP | 7-85797 | 3/1995 |

* cited by examiner

Primary Examiner—Michael H. Day
Assistant Examiner—Joseph Williams
(74) Attorney, Agent, or Firm—Staas & Halsey LLP

(57) ABSTRACT

The present invention relates to a plasma display panel comprising transparent electrodes and a dielectric layer covering said transparent electrodes on at least one substrate of a pair of substrates facing each other with a discharge space therebetween, the main constituent of the transparent electrodes is included in the dielectric layer. Further, the main constituent of the transparent electrode is indium oxide and indium oxide is included in the dielectric layer. By including the main constituent of the transparent electrodes in the dielectric layer, it is believed that the drop in conductivity caused by diffusion of the dielectric substance in the transparent electrodes during high-temperature processing is prevented.

5 Claims, 6 Drawing Sheets

PLASMA DISPLAY PANEL WITH DIELECTRIC LAYER SUPPRESSING REDUCED ELECTRODE CONDUCTIVITY

BACKGROUND OF THE INVENTION

1. Field of the Invention

The present invention relates to plasma display panels and a method of manufacturing them, and in particular relates to the dielectric layer covering the transparent electrodes.

2. Description of the Related Art

Plasma display panels (hereinbelow abbreviated to PDP) have attracted attention as large-screen full color display devices. In particular, in a three-electrode surface discharge type AC type PDP, a plurality of display electrode pairs that generate surface discharges are formed on a display side substrate. Address electrodes orthogonal to these display electrodes and a phosphor layer covering these are formed on a rear face substrate. The fundamental basis of driving a PDP is that a large voltage is supplied to the display electrode pairs to effect resetting. A discharge is generated between one electrode of an electrode pair and an address electrode, and a sustaining discharge is generated by applying a sustaining voltage across the display electrode pair utilizing the wall charge generated by this discharge.

A full colour display is achieved by emission of fluorescence colours, for example RGB (red, green, blue) by the phosphor layer provoked by the plasma generated by this sustaining discharge. A transparent electrode material is therefore employed for the display electrode pairs formed on the display side substrate.

This transparent electrode material is for example a semiconductor, typically consisting of ITO (a mixture of indium oxide $In_2O_3$ and tin oxide $SnO_2$). The conductivity of this is lower than that of a metal. In order to raise the conductivity, a thin metallic conducting layer is therefore added on top of the transparent electrodes.

However, the dielectric layer covering the transparent electrodes is normally formed by forming a layer of dielectric paste on the substrate and firing at high temperature. In this high-temperature firing step, or due to high temperature in subsequent operation, there is the problem that the resistance of the transparent electrodes rises. Such rise in the resistance of the transparent electrodes causes in particular a rise in the sustaining discharge voltage between transparent electrode pairs, making drive of the PDP difficult.

The cause of the rise of resistance of transparent electrode pairs is not absolutely certain but is inferred to be that the transparent electrodes and the dielectric layer that is in contact with and covers these react with each other under high temperature conditions. The result of such reaction is that the chief constituents that contribute to the conductivity of the transparent electrodes become included in the dielectric layer.

SUMMARY OF THE INVENTION

In view of the foregoing, it is an object of the present invention to provide a plasma display panel and method of manufacturing it whereby the rise of resistance of the transparent electrodes can be prevented.

A further object of the present invention is to provide a plasma display panel and method of manufacturing it whereby the sustaining discharge voltage can be kept low by lowering the resistance of the transparent electrodes.

In order to achieve the above object, according to the present invention, in a plasma display panel comprising transparent electrodes and a dielectric layer covering said transparent electrodes on at least one substrate of a pair of substrates facing each other with a discharge space therebetween, the main constituent of the transparent electrodes is included in the dielectric layer.

Further, in another invention, the main constituent of the transparent electrode is indium oxide and indium oxide is included in the dielectric layer. By including the main constituent of the transparent electrodes in the dielectric layer, it is believed that the drop in conductivity caused by diffusion of the dielectric substance in the transparent electrodes during high-temperature processing is prevented.

DESCRIPTION OF THE PREFERRED EMBODIMENTS

Embodiments of the present invention are described below with reference to the drawings. However, these embodiments are not limitative of the technical scope of the present invention.

Figure 1:
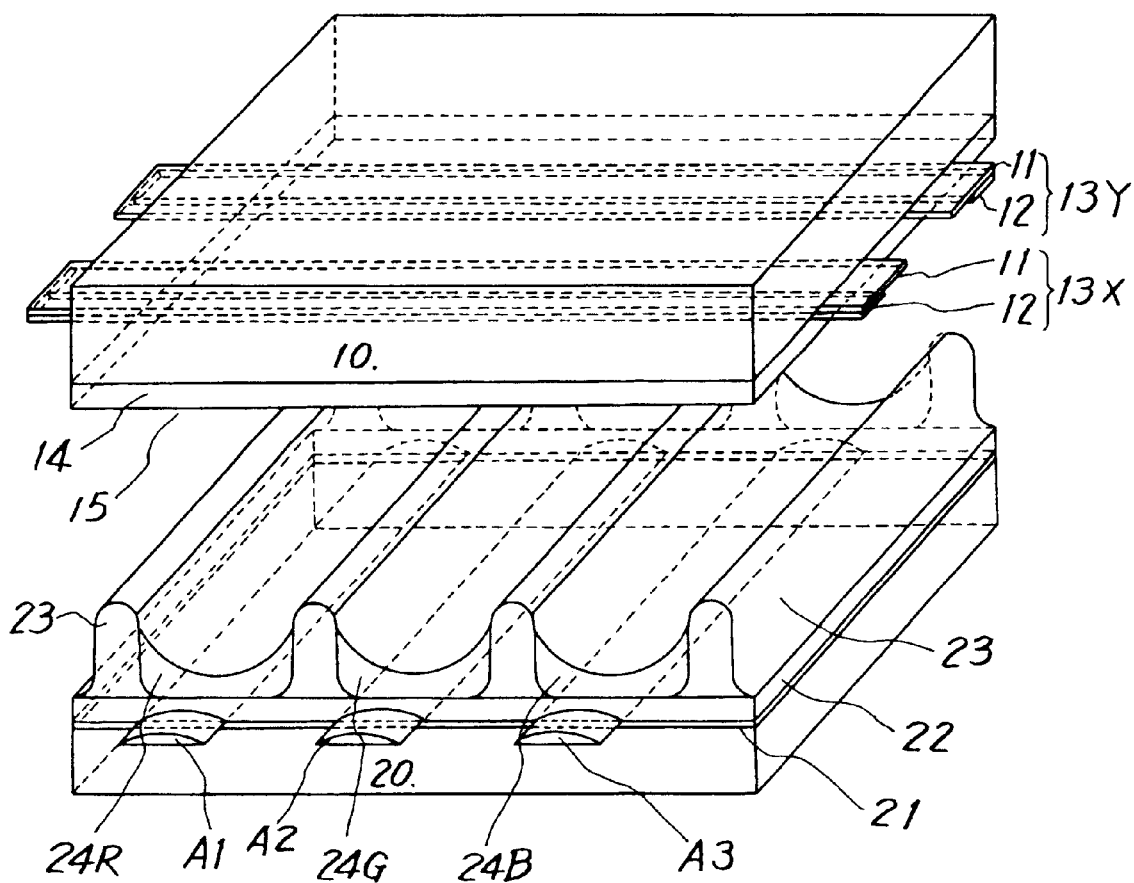
FIG. 1 is an exploded view of a PDP according to a embodiment of the present invention.
Figure 2:
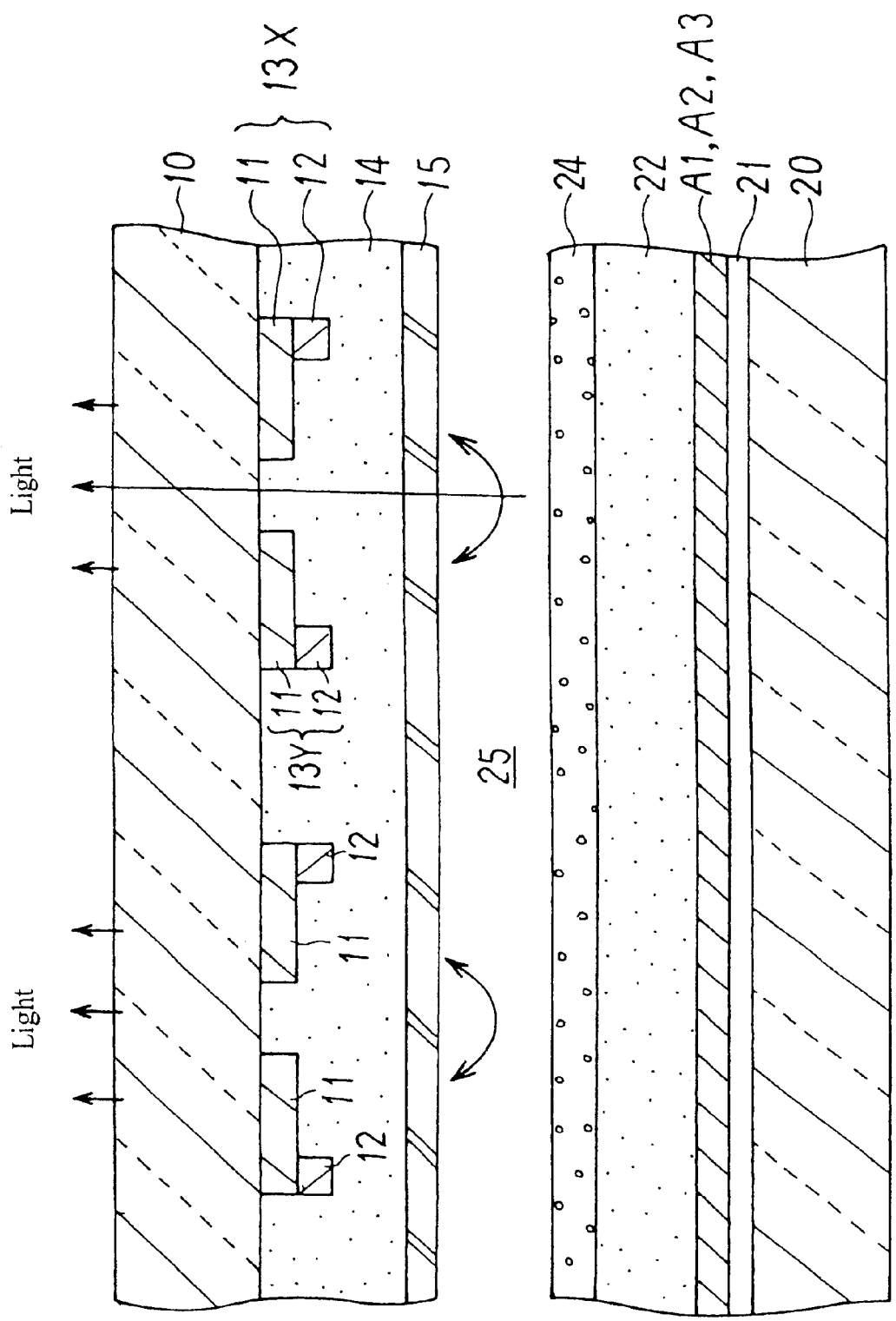
FIG. 2 is a cross-sectional view of the PDP.

FIG. 1 is an exploded perspective view of an AC type PDP of the three-electrode surface discharge type according to an embodiment of the present invention. FIG. 2 is a cross-sectional view of this PDP. The construction will be described with reference to both drawings. In this example, the display light issues in the direction (direction shown in FIG. 2) of the display-side glass substrate 10. 20 is the rear-face glass substrate. On the display-side glass substrate 10, there are formed X electrodes 13X and Y electrodes 13Y comprising transparent electrodes 11 and bus electrodes 12 of high electrical conductivity formed thereon (below in the drawing). These electrode pairs are covered by a dielectric layer 14 and protective layer 15 consisting of MgO. Bus electrodes 12 are provided along opposite edges of the X electrodes and the Y electrodes in order to supplement the conductivity of transparent electrodes 11.

These bus electrodes 12 are metal electrodes of, for example, a three-layer chromium/copper/chromium structure. Transparent electrodes 11 are usually constituted of ITO (indium tin oxide, a mixture of indium oxide $In_2O_3$ and tin oxide $SnO_2$), and have the bus electrodes 12 added to them in order to ensure sufficient electrical conductivity. Also, dielectric layer 14 is usually formed by a low-melting point glass material whose main constituent is lead oxide; more specifically, it is a $PbO$-$SiO_2$-$B_2O_3$-$ZnO$ type or $PbO$-$SiO_2$-$B_2O_3$-$ZnO$-$BaO$ type glass.

On rear face glass substrate 20, for example, on an underlayer passivation film 21 consisting of a silicon oxide film, there are provided stripe-form address electrodes A1, A2, A3, which are covered by a dielectric layer 22. Also, address electrodes A are formed between the partition walls (ribs) 23 of the stripe shapes, which are formed such that they are adjacent to these. These partitions walls 23 have two functions: a function of preventing effects on adjacent cells on addressing discharge and a function of preventing optical cross-talk. Red, blue and green phosphors 24R, 24G and 24B are separately applied on to each of adjacent ribs 23 so as to cover the address electrodes and rib wall faces.

Also, as shown in FIG. 2, display side substrate 10 and rear face substrate 20 are assembled with a gap of about 100 μm, the space 25 between them being sealed and filled with a mixed gas including Ne+Xe for the discharge.

Figure 3:
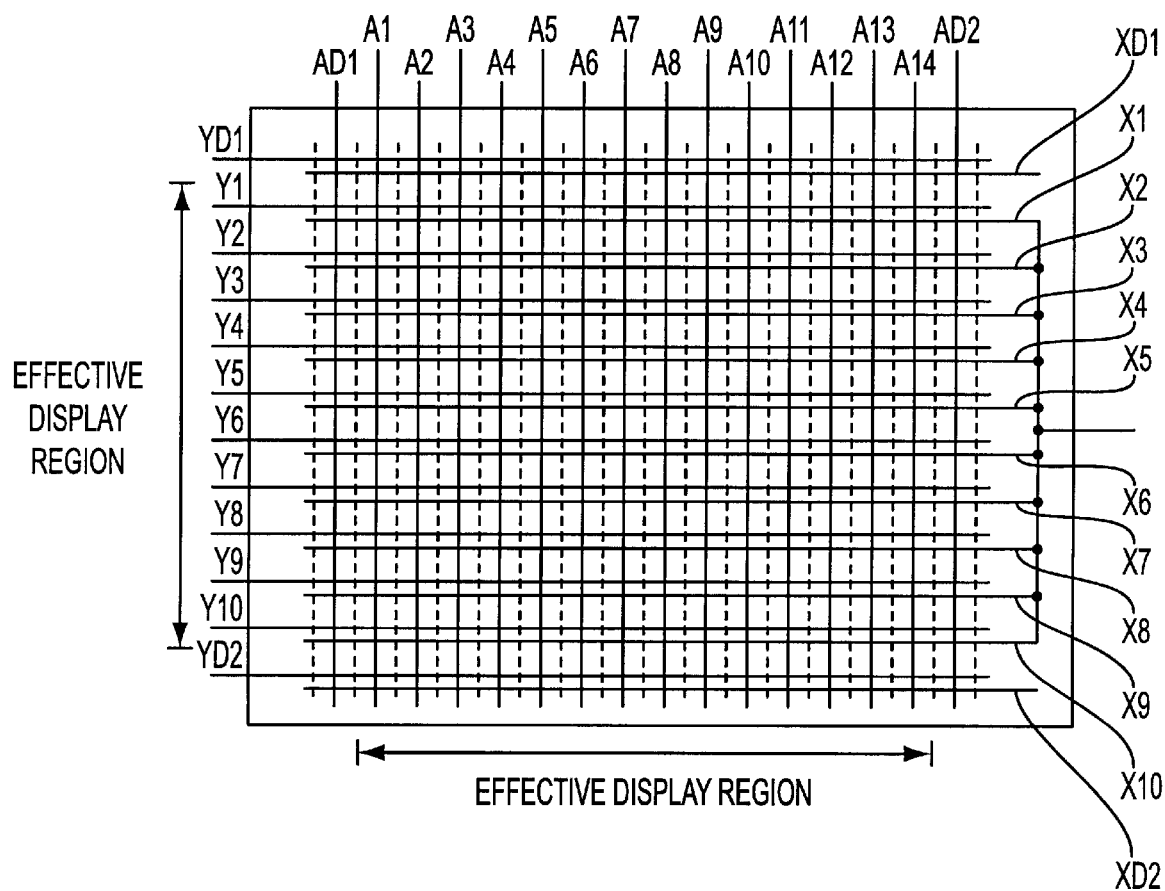
FIG. 3 is a plan view of a panel showing the relationship between the X and the Y electrodes of a three-electrode surface discharge type PDP and the address electrodes.

FIG. 3 is a plan view of the panel showing the relationship between the X and Y electrodes and the address electrodes of the three-electrode surface discharge-type PDP described above. X electrodes X1~X10 are arranged in parallel in the transverse direction and are connected in common at the substrate edge; Y electrodes Y1~Y10 are respectively arranged between the X electrodes and separately led out to the substrate edge. These X, Y electrodes are respectively paired to form display lines, and have discharge-sustaining voltages alternately applied for the display. XD1, XD2 and YD1, YD2 are dummy electrodes respectively provided outside the effective display region in order to moderate the non-linearity of the characteristics at the peripheral region of the panel. Address electrodes A1~A14 provided on rear face substrate 20 are arranged so as to intersect electrodes X and Y at right angles.

The X and Y electrodes are paired and have discharge sustaining voltages applied to them alternately, but the Y electrodes are utilized as scanning electrodes when writing information. The address electrodes are utilized for writing of information; plasma discharge for addressing purposes is generated between an address electrode and a Y electrode that is being scanned, in accordance with the information. An address electrode need therefore only conduct sufficient discharge current for one cell. Also, this discharge voltage can be driven at a comparatively low voltage, since it is determined in combination with the Y electrode. Such low-current, low-voltage drive makes it possible to achieve a large display screen.

Figure 4:
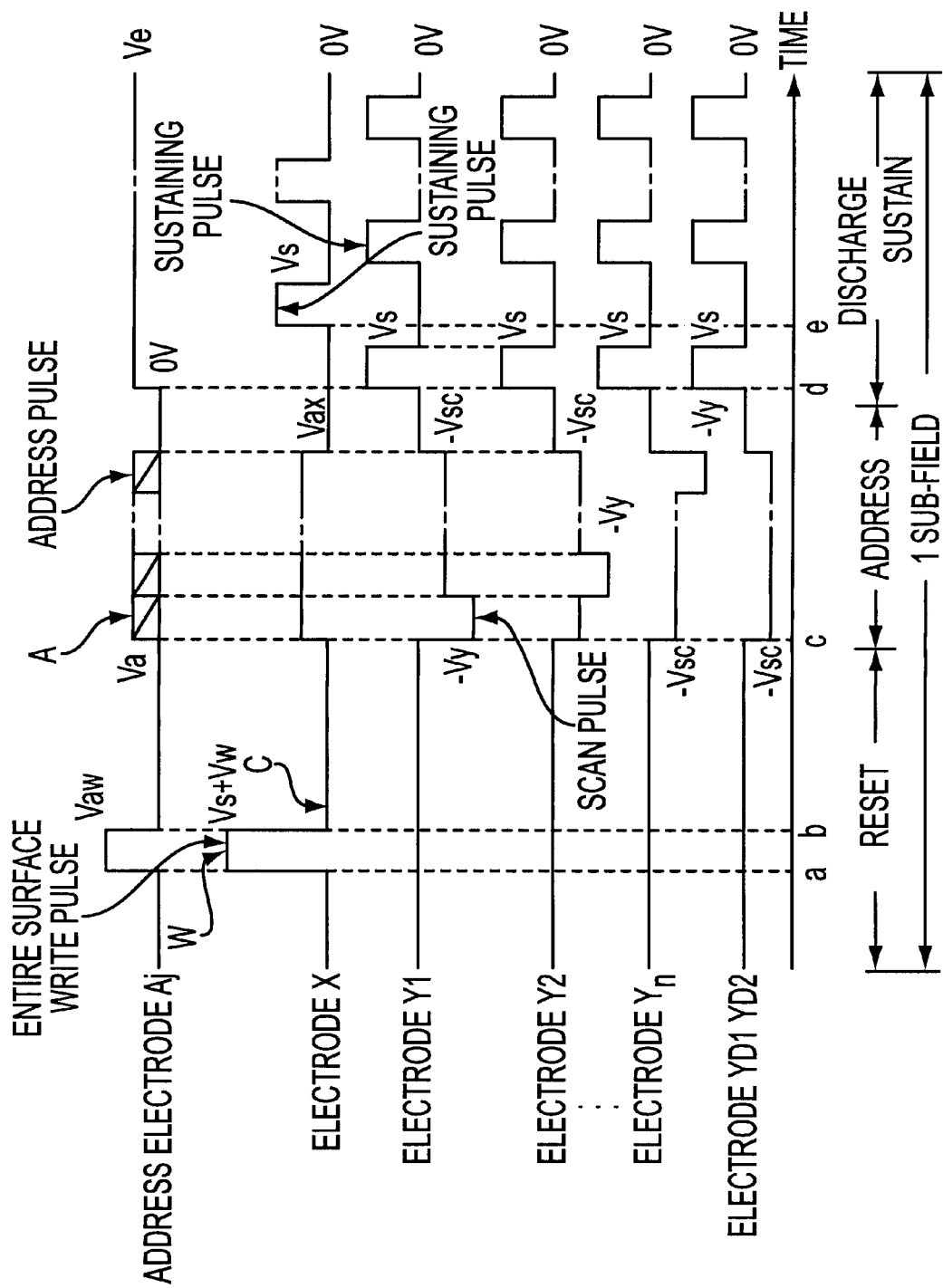
FIG. 4 is a waveform diagram of the electrode applied voltage given in explanation of the method of driving the PDP.

FIG. 4 is a waveform diagram of the voltage applied to the electrodes, given in explanation of a specific method of driving a PDP. The voltages applied to the respective electrodes are, for example, Vw=130 V, Vs=180 V, Va=50 V, −Vsc=−50 V, −Vy=−150 V; Vaw, Vax are set to potentials which are intermediate the voltages respectively applied to the other electrodes.

A single subfield in the drive of a three-electrode surface discharge type PDP comprises a reset period, addressing period, and discharge sustaining period (display period).

In the reset period, discharge between the XY electrodes is generated over the entire surface of the panel (W in the Figure) by applying an entire-surface write pulse to the X electrodes, which are connected in common, at time a–b. Of the electrical charges that are generated in space 25 by this discharge, the positive charges are attracted towards the Y electrode, which is of low voltage, while the negative charges are attracted towards the X electrode, which is of high voltage. As a result, at the time point b when the write pulse disappears, due to the high electrical field produced by the charges that have now been thus attracted and accumulated on dielectric layer 14, discharge is again generated between the X electrode and Y electrode (C in the drawing). As a result, all of the charge on the X and Y electrodes is neutralized, and resetting of the entire panel is completed. Period b–c is the time required for this charge neutralization.

Next, in the addressing period, −50 V (−Vsc) is applied to the Y electrodes and 50 V (Va) is applied to the X electrodes and, while. While sequentially applying a further scanning pulse of −150 V (−Vy) to the Y electrodes, an address pulse of 50 V (Va) is applied to the address electrode in accordance with the information to be displayed. As a result, a large voltage of 200 V is applied between the address electrode and scanning electrode, causing a plasma discharge to be generated.

However, since the voltage and pulse width are not so large as in the case of the entire-surface write pulse that was applied on resetting, an opposite discharge due to accumulated charge when application of the pulse is terminated is not produced. Thus, of the space charge generated by the discharge, the negative charges are accumulated on the X electrode and address electrode side to which 50 V is applied, while the positive charges are accumulated on the Y electrode side, to which −50 V is applied. The charges are accumulated on the respective dielectric layers 14 and 22.

Finally, in the discharge sustaining period, utilizing the wall charge stored in the addressing period, display discharge is performed in accordance with the display luminance. Specifically, a sustaining pulse Vs, such that discharge takes place in the case of cells where there is a wall charge but discharge does not take place in the case of cells where there is no wall charge, is applied between electrodes X, Y. As a result, in the case of the cells where wall charge was accumulated during the addressing period, discharge is repeated, alternately between electrodes X and Y. The luminance of the display is indicated in accordance with the number of these discharge pulses. A multi-gradation display can therefore be achieved in which this subfield is repeated a plurality of times with a weighted discharge sustaining period. A full colour display can therefore be implemented by combination with RGB cells.

In this discharge sustaining period, as shown by the arrows in FIG. 2, plasma discharge for discharge sustaining is generated by means of the sustaining voltage Vs applied between a pair of transparent electrodes 11 and the voltage produced by the charge accumulated on the surface of dielectric layer 14 (actually, the surface of protective layer 15). The ultraviolet rays generated from this thus-produced plasma are directed on to phosphor layer 22, where they generate light of respective colours. This light issues on to the display side substrate 10 as shown by the arrows.

As described above, since a transparent electrode 11 is a semiconductor layer whose own conductivity is not very high, a metallic bus electrode 12 is provided at both its edges. The resistance in the longitudinal direction of X electrode 13X and Y electrode 13Y can therefore be kept low even if the conductivity of transparent electrode 11 decreases somewhat due to some sort of reaction between transparent electrode 11 and dielectric layer 14.

However, when the conductivity of the transparent electrode 11 drops, its width-direction resistance also rises, so it becomes necessary to raise the discharge sustaining voltage Vs needed to sustain discharge. Specifically, this is because the sustaining discharge is generated substantially between bus electrodes 12 as the resistance of the transparent electrodes 11 rises. Since the distance between bus electrodes 12 is longer than the distance between transparent electrodes 11, a higher discharge voltage is needed to effect discharge therebetween.

Accordingly, in an embodiment of the present invention, in order that the conductivity of transparent electrode 11 should not drop, the main constituent of the transparent electrodes is included in dielectric layer 14 that covers and contacts transparent electrodes 11. For example, if transparent electrodes 11 are ITO (95 wt. % indium oxide, 5% tin oxide), particles of indium oxide $In_2O_3$ are mixed into dielectric layer 14. Or, the composition of the glass of dielectric layer 14 is doped with indium oxide. As a result, even when subjected to the subsequent high-temperature firing step, chemical reaction or mutual diffusion of material between dielectric layer 14 and transparent electrode 11 is prevented.

For example, if it is assumed that dielectric layer 14 is a low melting point glass whose main constituent is lead oxide, it is prevented that this lead oxide (PbO) is diffused between the boundaries of the crystalline grains in transparent electrode 11, thereby the resistance of the transparent electrode 11 rises. That is, it is believed that, since conductive indium oxide (N-type semiconductor) is contained in the glass material of dielectric layer 14, the chemical reactions in which the indium oxide, which is the main constituent of the transparent electrode, diffuses into the dielectric layer 14 and the lead oxide in the dielectric layer 14 diffuses into the transparent electrode 11 are respectively suppressed. That is, it is believed that mutual diffusion is suppressed by the achievement of a chemical equilibrium condition.

Figure 5:
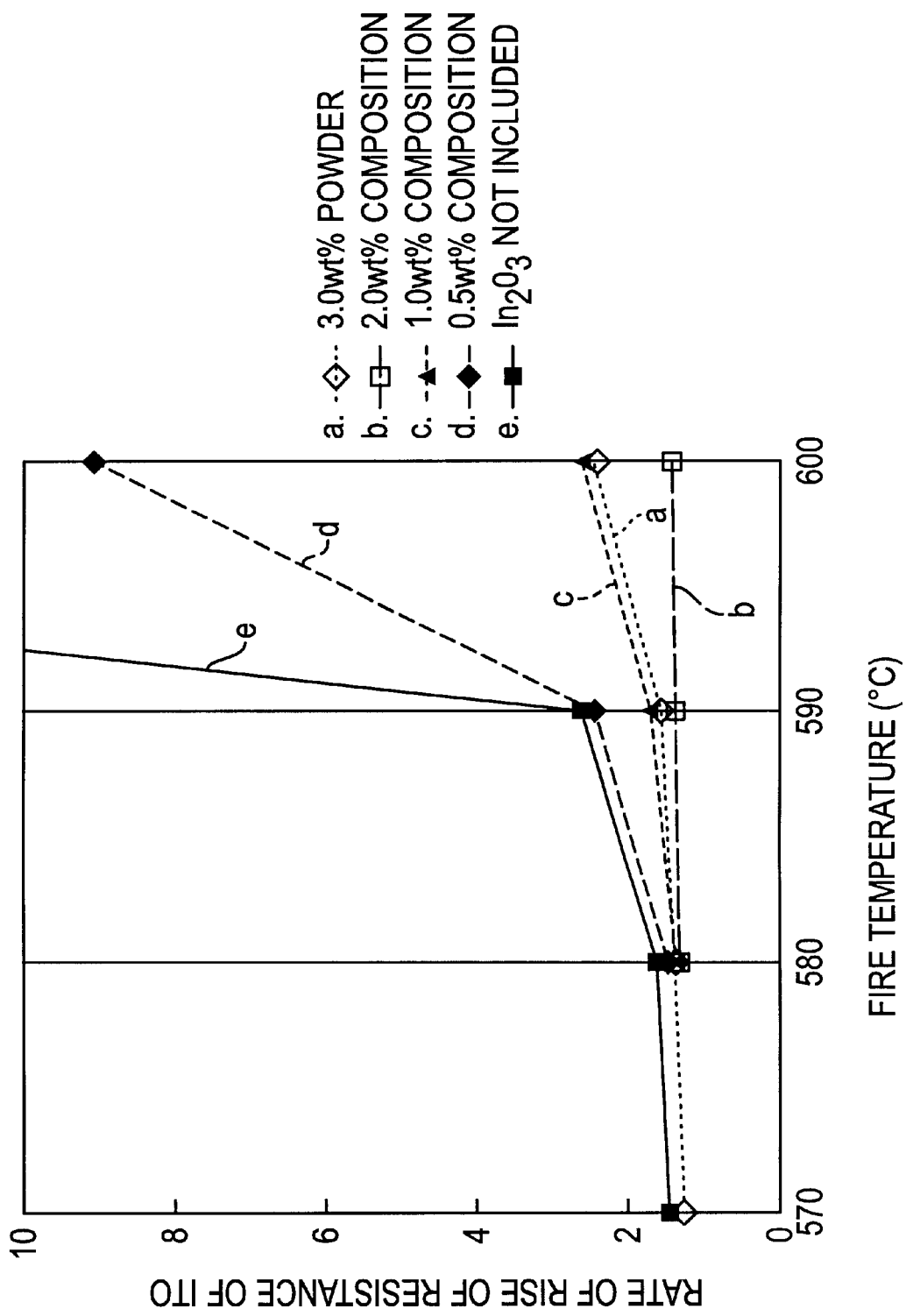
FIG. 5 is a graph showing the relationship between the rate of rise of resistance of the transparent electrodes consisting of ITO and temperature, when indium oxide is included in the dielectric layer.

FIG. 5 is a graph showing the relationship between the rate of rise of resistance of transparent electrode 11 including ITO and temperature, when indium oxide is contained in dielectric layer 14. This graph shows the results obtained by forming a dielectric layer 14 on to a substrate formed with a transparent electrode 11 including ITO as shown in FIG. 2, such as to cover transparent electrode 11, and measuring the rate of change of resistance of transparent electrode 11 after firing, varying the firing temperature. As the sample, ITO containing 95 wt. % of indium oxide $In_2O_3$ and 5 wt. % of tin oxide $SnO_2$ was used for the transparent electrode, while a glass composition based on $PbO$-$SiO_2$-$B_2O_3$-$ZnO$-$BaO$ was used for the dielectric layer. The measurements were carried out using five samples: a sample (a in the Figure) obtained by mixing 3.0 wt. % of indium oxide grains or powder with the glass material, a sample (b in the Figure) obtained by including 2.0 wt. % of indium oxide in the glass composition, a sample (c in the Figure) obtained by including 1.0 wt. % of indium oxide in the same, a sample (d in the Figure) obtained by including 0.5 wt. % of indium oxide in the same, and a sample (e in the Figure) in which no indium oxide was included.

In order to achieve mixing of the particles of indium oxide with the glass material, for example particles of indium oxide of about 100 Angstrom are mixed with the glass powder together with a suitable solvent and binder to form a paste, which is printed on to the substrate by screen printing and then fired. The particles of indium oxide must be made as small as possible so that they do not have the effect of screening the display light.

Also, in order to achieve inclusion of the indium oxide in the glass composition, the indium oxide powder may be mixed with the glass powder whose main constituent is for example lead oxide, and the mixture melted under high temperature of about 1300° C. The indium oxide is thereby incorporated into the glass composition. The mixture is then cooled from the molten condition, pulverized, and converted to the form of a paste using a solvent and binder, after which printing and firing are performed. The firing temperature is usually about 580° to 600°; melting does not take place in this step.

As is clear from the measurement results, in the case of sample e in which the dielectric layer does not contain indium oxide, the resistance of the transparent electrode shows a rapid rise when the firing temperature gets above 580° C. When 600° C. is exceeded, this rise in resistance becomes nearly infinitely large so that conductivity is practically lost. Consequently, in the case of where indium oxide is not present, the firing temperature must be made correspondingly lower, with the result that either sufficient firing cannot be achieved or a firing step lasting a long time is required.

In contrast, in the case of samples a, b, c, d, in which indium oxide is present in the dielectric layer, the rise in resistance of the transparent electrode is suppressed even though the firing temperature exceeds 590° C. In particular, in sample b, in which 2 wt. % of indium oxide is present in the composition, even though the firing temperature exceeds 590° C., there is scarcely any rise in the resistance of the transparent electrode. Sample a, in which 3 wt. % of indium oxide particles (powder) were admixed, and sample c, which contained 1 wt. % of indium oxide in the composition, show practically the same characteristic, with scarcely any rise of the resistance of the transparent electrode even at temperatures above 600° C. The reason why sample b shows better results than sample a is that the indium oxide is practically uniformly distributed in the glass.

Figure 6:
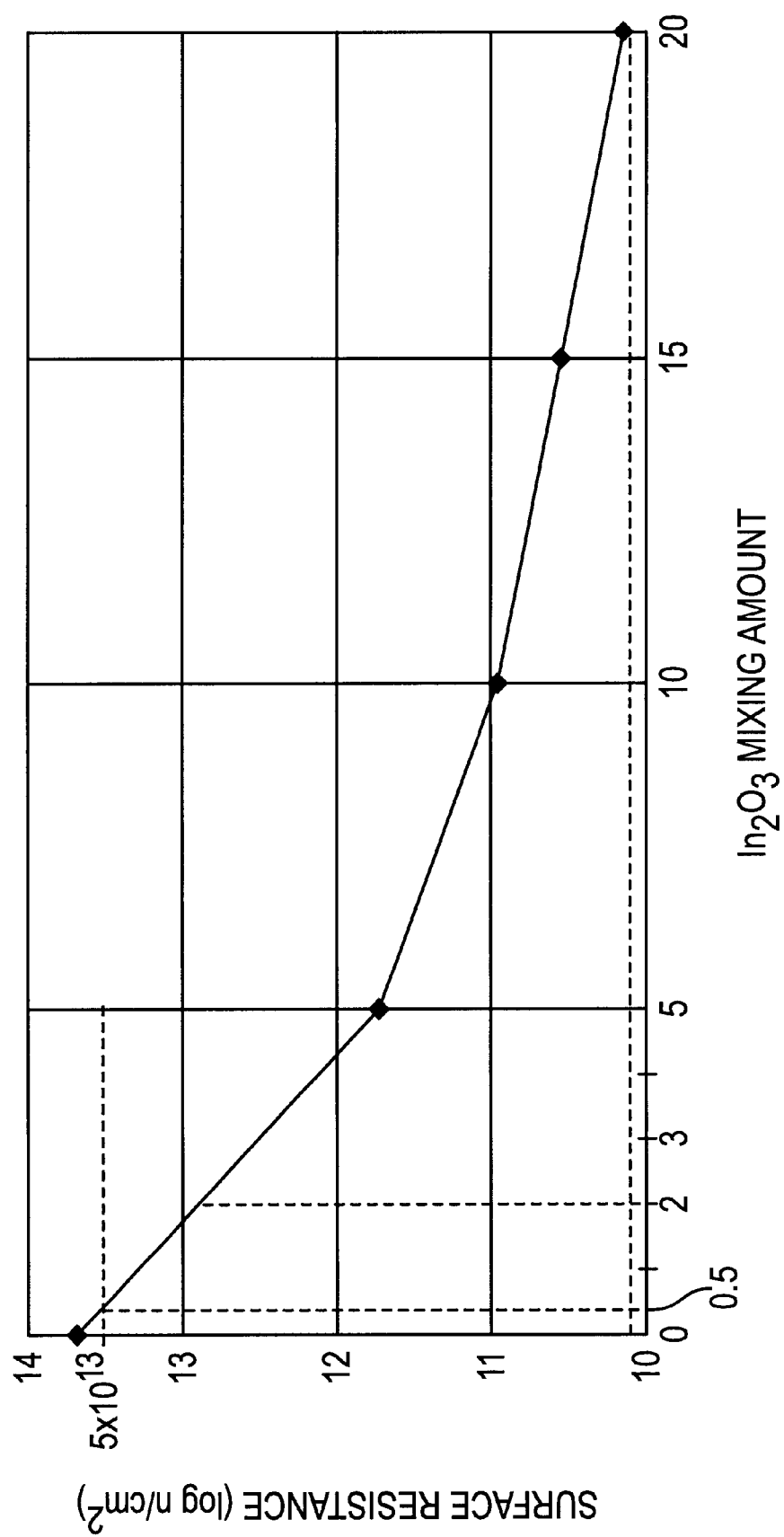
FIG. 6 is a graph showing the change of surface resistivity of the dielectric layer when particles of indium oxide are admixed with the dielectric layer.

FIG. 6 is a graph showing the change of surface resistivity of the dielectric layer when particles of indium oxide are mixed with the dielectric layer. This example is a case in which particles of indium oxide were mixed with a paste of low-melting point glass whose main constituent is lead oxide, as described above. The indium oxide is an N-type semiconductor material and a conducting oxide material. The surface resistance of the dielectric layer is therefore lowered by increasing the amount of this which is mixed therewith. As can be seen from this graph, if the content of indium oxide is increased to about 10 wt. %, the value of this surface resistance decreases by two orders of magnitude or more from the case where there is no indium oxide content, and decreases by about one order of magnitude from the case where the indium oxide content is 3 wt. %.

Dielectric layer 14 provides insulation between the transparent electrodes and must store the charges generated during addressing discharge, so excessive decrease in its resistance must be avoided. The upper limit on the amount of indium oxide particles can be admixed is therefore about 10 wt. %. Also, the lower limit, at which the rise in resistance of the transparent electrodes is suppressed to some degree is about 0.1 wt. %.

From the results of the above investigation, it can be seen that including the main constituent of the transparent electrodes in the dielectric layer 14 that covers and contacts transparent electrodes 11 is beneficial in ensuring that the conductivity of transparent electrodes 11 is not lowered by high temperature processing such as firing.

Accordingly, in a method of manufacturing a plasma display panel according to the present invention, when printing glass paste covering the transparent electrodes on to a substrate formed with transparent electrodes, it is beneficial to include the main constituent of the transparent electrodes in the glass paste. Methods of including the main constituent of the transparent electrodes in the glass paste constituting the dielectric material include the method of admixing particles as described above and the method of combining the main constituent with the glass composition by melting. With such a method of manufacture, the conductivity of the transparent electrodes is not lowered even by high temperature processing for firing the glass paste or by high temperature processing in the step of subsequently sealing the two glass substrates together.

In the embodiments described above, low melting point glass whose chief constituent is lead oxide has been described as an example of the dielectric material. In the case of substances other than this, such as low melting point glass whose main constituent is bismuth oxide ($ZnO-Bi_2O_3$) or phosphate-based low melting point glass ($PO_4$), the same benefit can be expected by including in these the main constituent of the transparent electrodes.

As described above, according to the present invention, by including in the dielectric layer covering the transparent electrodes the main constituent of the transparent electrodes of the plasma display panel, a fall in the conductivity of the transparent electrodes can be prevented. Consequently, there is no need to increase the discharge sustaining voltage that is applied between the transparent electrodes. Alternatively, there is no need to adopt a design with greater thickness or width of the transparent electrodes.

What is claimed is:

1. An AC type plasma display panel, comprising:
   a pair of substrates facing each other with a discharge space therebetween;
   transparent electrodes formed of indium oxide, as a main constituent, on at least one of said substrates; and
   a dielectric layer formed of a low melting point glass and provided on said transparent electrodes and on said at least one of said substrates;
   wherein the indium oxide is included in said dielectric layer in a weight ratio of indium oxide with respect to said dielectric layer of 0.1 to 10 wt. %.

2. An AC type plasma display panel according to claim 1, wherein the weight ratio of indium oxide with respect to said dielectric layer is 0.5 to 3.0 wt. %.

3. An AC type plasma display panel according to claim 1, wherein the indium oxide is incorporated in a weight ratio of 0.5 to 2.0 wt. % into a glass composition, used to form the dielectric layer, of any of a low melting point glass whose main constituent is lead oxide, a low melting point glass whose main constituent is bismuth oxide, and a phosphate-based low melting point glass.

4. An AC type plasma display panel according to claim 1, wherein the indium oxide is incorporated in a weight ratio of 0.5 to 2.0 wt. % into a glass composition used to form the low melting point glass.

5. A substrate article for an AC type plasma display panel, said article comprising:
   a substrate having a surface;
   transparent electrodes formed of indium oxide, as a main constituent, on the surface of said substrate ; and
   a dielectric layer formed of a low melting point glass on the transparent electrodes and the surface of said substrate;
   wherein the indium oxide is included in said dielectric layer in a weight ratio of indium oxide with respect to said dielectric layer of 0.1 to 10 wt. %.

* * * * *